(12) United States Patent
Guenther et al.

(10) Patent No.: US 7,498,737 B2
(45) Date of Patent: Mar. 3, 2009

(54) METHOD OF MANUFACTURING AN ORGANIC ELECTRONIC DEVICE AND ORGANIC ELECTRONIC DEVICE

(75) Inventors: Ewald Karl Michael Guenther, Regenstauf (DE); Karsten Heuser, Erlangen (DE); Georg Wittmann, Herzogenaurach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 95 days.

(21) Appl. No.: 10/569,818

(22) PCT Filed: Aug. 9, 2004

(86) PCT No.: PCT/EP2004/008909

§ 371 (c)(1),
(2), (4) Date: Nov. 1, 2006

(87) PCT Pub. No.: WO2005/022662

PCT Pub. Date: Mar. 10, 2005

(65) Prior Publication Data

US 2007/0063636 A1    Mar. 22, 2007

(51) Int. Cl.
*H01J 1/62* (2006.01)
(52) U.S. Cl. .................... 313/504; 445/24; 427/66; 430/311
(58) Field of Classification Search ......... 313/498–512; 315/169.1, 169.3; 428/690–691, 917; 438/26–29, 438/34, 82; 257/40, 72, 98–100, 642–643, 257/759; 427/66, 532–535, 539, 58, 64; 445/24–25, 26; 430/311–321
See application file for complete search history.

(56) References Cited

U.S. PATENT DOCUMENTS

| 5,804,917 | A | 9/1998 | Takahashi et al. |
| 6,117,529 | A * | 9/2000 | Leising et al. ............ 428/209 |
| 6,739,931 | B2 * | 5/2004 | Yamazaki et al. .......... 445/24 |
| 2002/0163300 | A1 * | 11/2002 | Duineveld et al. ......... 313/505 |

(Continued)

FOREIGN PATENT DOCUMENTS

| JP | 08-222371 | 8/1996 |
| JP | 10-233286 | 9/1998 |
| JP | 2001-244073 | 9/2001 |

OTHER PUBLICATIONS

International Search Report and Written Opinion of the International Searching Authority, International Application Serial No. PCT/EP2004/008909, Aug. 27, 2003, 10 pp.

*Primary Examiner*—Peter J Macchiarolo
*Assistant Examiner*—Donald L Raleigh
(74) *Attorney, Agent, or Firm*—Fish & Richardson P.C.

(57) ABSTRACT

The invention discloses a method for manufacturing an organic electro-luminescent display device, the method comprising the steps of: providing a light-permeable substrate; arranging a plurality of transparent electrodes in a stripe-like manner on the light-permeable substrate, the transparent electrodes being made of a light-permeable conductive film; forming at least one organic layer on the subassembly, the at least one organic layer being made of an organic electro-luminescent medium so that the at least one organic layer covers the electrodes; forming a conductive film all over the at least one organic layer; and removing at least one portion of the conductive film so as to create stripe-like electrodes being electrical isolated to each other and extending in a direction perpendicular to the transparent electrodes using a radiation method.

23 Claims, 2 Drawing Sheets

U.S. PATENT DOCUMENTS

Figure 1A:
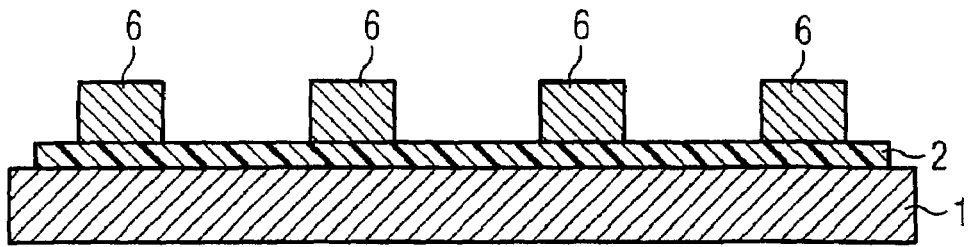
Figure 1B:
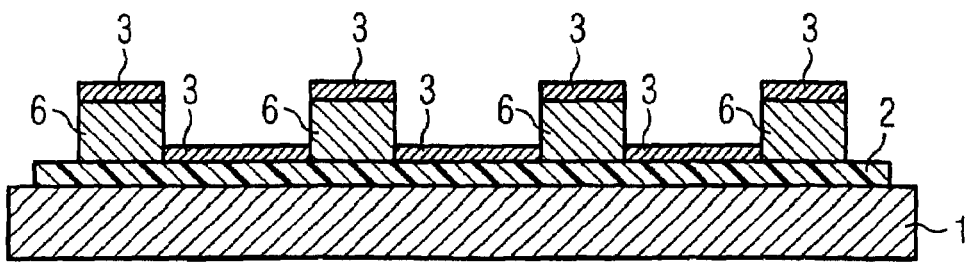
Figure 1C:
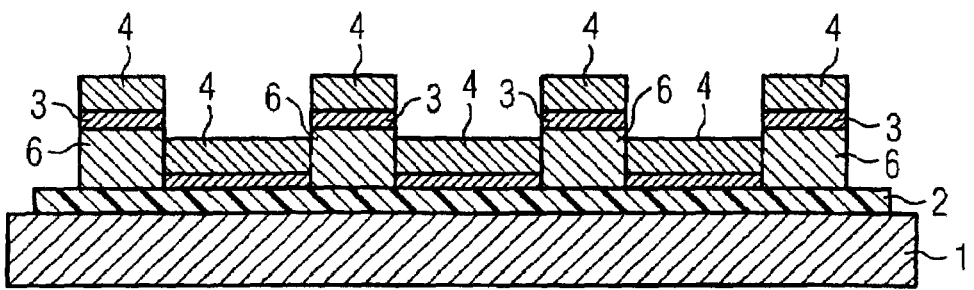

| | | |
|---|---|---|
| 2003/0129297 A1* | 7/2003 | Jakobi et al. .................. 427/66 |
| 2003/0234398 A1* | 12/2003 | Aoki et al. .................... 257/72 |
| 2004/0062857 A1* | 4/2004 | Nagayama et al. ............ 427/66 |
| 2004/0135151 A1* | 7/2004 | Okamoto et al. .............. 257/72 |
| 2005/0009227 A1* | 1/2005 | Xiao et al. .................... 438/82 |
| 2006/0105492 A1* | 5/2006 | Veres et al. .................... 438/99 |

* cited by examiner

METHOD OF MANUFACTURING AN ORGANIC ELECTRONIC DEVICE AND ORGANIC ELECTRONIC DEVICE

BACKGROUND OF THE INVENTION

This invention relates to a method for manufacturing an organic electro-luminescent display device, and more particularly to an organic electro-luminescent display device including an organic electro-luminescent medium and an electronic-device being manufactured after this method.

A conventional organic electro-luminescent element includes a transparent film-like ITO electrode formed on a glass substrate, a hole transport layer arranged on the ITO electrode though as to cover it, a film-like luminous layer formed on the hole transport layer, and an upper electrode formed on the luminous layer.

In the conventional electro-luminescent element thus constructed, when a negative DC voltage and a positive DC voltage are applied to the upper electrode and ITO electrode, respectively, holes injected from the ITO electrode are injected into the luminous layer while being transported through the hole transport layer. Whereas, electrons are injected from the upper electrode in the luminous layer, so that the electrons thus injected and the holes injected from the hole transport layer are recombined with each other in the luminous layer.

Such a recombination leads to luminescence of the luminous layer, which may be observed through the light-permeable hole transport layer, ITO electrode and glass substrate.

An organic electro-luminescent display device utilizing a luminous principle of the electro-luminescent element thus formed is constructed in such a manner that a plurality of ITO electrodes each acting as a lower electrode are formed in a stripe-like manner and a plurality of upper electrodes are arranged in a stripe-like manner and so as to extend in a direction perpendicular to the stripe-like ITO electrodes, resulting in forming a matrix by cooperation between the ITO electrodes and the upper electrodes. Then, the matrix is scanned by a drive means, so that luminescence of picture cells defined at intersections on the matrix is controlled in order by an image signal, leading to display of an image.

In such image display, resolution is determined depending on a width of each of the ITO electrodes and upper electrodes arranged in a stripe-like manner. The width is desirably as small as ten microns or less in view of resolution required.

In general, the ITO electrodes and upper electrodes each are formed by mask deposition. Unfortunately, the mask deposition fails to form a fine pattern as small as 0.1 mm or less. Wet chemical patterning technics permit formation of fine or precise patterns. However, wet etching causes an organic electro-luminescent medium to be contacted with an etching liquid or the like, to thereby be deteriorated in characteristics, so that the quality of image display and durability thereof is deteriorated.

An organic electro-luminescent display device and method for manufacturing the same which is intended to solve such a problem as described above is proposed in U.S. Pat. No. 5,804,917. This display device includes a lower substrate made of a transparent material, which has a plurality of light-permiable transparent electrodes made of ITO or the like and arranged thereon in a stripe-like manner. The display device further includes an organic layer made of an organic electro-luminescent medium and arranged between each adjacent two of a plurality of ribs so as to extend in a direction perpendicular to the transparent electrodes. The organic layers each have an upper elctrode formed on only a whole upper surface thereof. The upper electrodes are arranged in a stripe-like manner. The ribs are made of an insulating material and arranged so as to be spaced from each other at predetermined intervals and extend in a direction perpendicular to the transparent electrodes. The ribs each function as a spacer for supporting an upper substrate and lower transparent substrate while spacing both substrates from each other at a predetermined interval. The ribs may be made of a suitable material such as a lead glass having a black pigment added thereto or the like and arranged so as to be perpendicular to the transparent electrodes.

Between each adjacent two of the ribs the organic layer acting as a light emitter and the upper electrodes which are in the form of a thin film are laminatedly arranged in order. The organic layers and upper electrodes are arranged so as to be perpendicular to the transparent electrodes.

Manufacturing of the display device constructed in such a manner as described above and in particular forming of the upper electrodes requires quite complicated process steps. The upper electrodes are formed in the form of a film on the organic layer. In one suggested process the process is a maskless process which takes place without using a mask. More particularly, a conductive material for the upper electrodes is deposited on the transparent electrodes on which the organic layers and ribs are formed. Then, a portion of the material formed on the ribs is removed by scraping, rubbing or the like. Removing of the conductive material formed on the ribs has to be carried out by using a mechanical process, thereby adding costs for manufacturing.

SUMMARY OF THE INVENTION

The present invention has been made in view of the forgoing disadvantage of the prior art.

Accordingly, it is an object of the present invention to provide a method for manufacturing an organic electro-luminescent display device which is capable of forming upper electrodes in a fine pattern.

It is another object of the present invention to provide a method to enable a process which is much more easier and less expensive than the method of the prior art.

It is a further object of the present invention to provide an organic electro-luminescent display device which is capable of forming upper electrodes in a fine pattern and which is capable of exhibiting improved durability.

The present invention meets these needs by providing a method for manufacturing an organic electro-luminescent display device according to base claim 1. Further, the present invention meets these need by providing an organic electronic device according to base claim 15. Favourable embodiment of the invention are subject of further dependent claims.

The method for manufacturing an organic electro-luminescent display device comprises the steps of:
  providing a light-permeable substrate;
  arranging at least one transparent electrode on the light-permeable substrate, the transparent electrodes being made of a light-permeable conductive film;
  forming at least one organic layer on the subassembly, the at least one organic layer being made of an organic electro-luminescent medium so that the at least one organic layer covers the electrodes;
  forming a conductive film all over the at least one organic layer; and
  removing at least one portion of the conductive film so as to create electrodes being electrical isolated to each other using a radiation method. Preferable a plurality of transparent electrodes is arranged in a stripe-like manner on the substrate and stripe-like electrodes extending a direction perpendicular to the transparent electrodes are created of the conductive film.

In contrast to conventional methods for manufacturing a display device, the method of the present invention removes parts of the conductive film by using a radiation method. The radiation method may comprise using a laser beam or using an electron beam (e-beam). With a radiation method it is possible to form upper electrodes in a very fine pattern without the need of using a mechanical process for removing parts of the conductive film. Therefore the method according to the present invention is much more easier and quicker to carry out, thus reducing costs of manufacturing.

Furthermore it is not necessary to provide insulating ribs or any insulating material which has been used in the past to separate the upper stripe-like electrodes.

By using a radiation method for removing at least one portion of the conductive film so as to create stripe-electrodes being electrical isolated to each other the portions to be removed can be defined that precise that the plurality of transparent electrodes will not be hurt.

In another embodiment the step of at least removing the conductive film may comprise removing of at least a portion of the organic layer. So the organic layer can be removed at all or only partially. In the latter a groove or a valley will be formed within the organic layer.

The step of forming a conductive film can be carried out by vacuum deposition. With this method it is very easy to build a conductive film over the at least one organic layer. Of course it is possible to use any other method known in the prior art, which is suitable for forming the conductive film over the at least one organic layer.

In another favourable embodiment the method for manufacturing the display device may futher comprise the step of forming a plurality of insulating ribs in a stripe-like manner on the transparent electrodes so as to extend in a direction perpendicular to transparent electrodes and removing the at least one portion of the conductive film on the insulating ribs using a radiation method. As disclosed in the U.S. Pat. No. 5,804,917 this embodiment also includes the step of forming of insulating ribs. The height of the insulating ribs according to the invention is not relevant. The purpose of the insulating ribs is to provide a layer in which the radiation can engage so that there is no danger to hurt the organic layer and especially the transparent electrodes. The conductive film on the insulating ribs could be removed completely. But as will be apparent to one skilled in the art it is sufficient to remove only that much of the conductive film so that an isolation is achieved.

Preferably the step of forming the plurality of ribs on the transparent electrodes comprises arranging the plurality of ribs in laterally spaced rows so as to be parallel to each other. In doing so it is ensured that insulating material is provided in these positions where the conductive film will be removed in the removing-step.

It is preferred, when the step of forming the plurality of ribs on the transparent electrodes comprises providing heat to the ribs to cross-link the material of the ribs. The insulating material will be resistant against solving agents and chemicals which may be used in further process steps.

In one embodiment the plurality of ribs are made of a photoresist and will be subjected to heat of approximately 220° C.

Further, it is preferred when the step of forming the plurality of ribs on the transparent electrodes comprises chamfering the edges of the ribs opposite to the transparent electrodes. Chamfering of the edges causes no problems with the following step of applying PEDOT and PPV, which represent materials of the at least one organic layer.

In onother embodiment of the present invention the step of at least removing the conductive film may comprise removing of at least a portion of the insulating rib. This situation may appear, when it is not possible to adjust the laser or electron beam that precisely to only remove parts of the conductive film. Thereby, removing of the at least one organic layer and the insulating rib may cause the shape of an "U" of the insulating member.

It is pointed out, when the step of forming a plurality of insulating ribs in a stripe-like manner on the transparent electrodes is provided, this step will be carried out prior to forming the at least one organic layer and the conductive film or over the at least one organic layer.

The organic electro-luminescent display device according to the present invention comprises:
  a light-permeable substrate;
  at least one transparent electrode arranged on the light-permeable substrate and formed of a light-permeable conductive film;
  a plurality of insulating members comprising a valley and consisting at least partially of an insulating material and arranged on the transparent electrodes;
  at least one organic layer each formed of an organic electroluminescent medium and arranged at least between each adjacent two of the insulating members; and
  upper electrodes each made of a conductive film deposited all over the at least one organic layer.

Preferably a plurality of transparent electrodes is arranged on the substrate in a stripe-like manner. Accordingly the insulating members are formed in a stripe-like manner on the transparent electrodes extending in a direction perpendicular to the transparent electrodes.

Due to the fact, that removing of at least one portion of the conductive film is carried out by a radiation method, the insulating members will comprise a valley or a groove.

The insulating member may comprise portions of the organic electro-luminescent medium in the case, no insulating ribs were formed on the transparent electrodes.

In another embodiment the insulating member may comprise an insulating material provided to create insulating ribs and the organic electro-luminescent medium on top of it.

Depending on how much material has been removed by the laser beam or the electron beam, the insulating member may comprise in a further embodiment an insulating material provided to create insulating ribs, the organic electro-luminescent medium on top of it and part of the conductive film.

In all mentioned embodiments the insulating member may have the shape of an "U". The ends of the legs of the "U" may comprise the medium of the at least one organic layer and further material of the conductive film.

In the following the invention will be explained in more detail by figures. All figures are just simplified schematic representations presented for illustrations purposes only.

DESCRIPTIONS OF THE DRAWINGS

FIG. 1a-d illustrate different steps in an example of forming a subassembly for an organic electro-luminescence display device of the present invention, and FIGS. 2a-d illustrate different steps in another example of forming a subassembly for an organic electro-luminescent display device of the present invention.

Now, a method for manufacturing an organic electro-luminescent display device according to the present invention will be described herein after with reference to FIG. 1a-1d. Referring first to FIG. 1a transparent substrate 1 is provided. The substrate is made of an insulating material such as glass or the like. A plurality of light-permeable transparent electrodes 2 made of ITO or the like are arranged thereon in a stripe-like manner. Since FIG. 1a-1d show cross sectional views only one stripe is visible. The transparent ITO electrodes comprise a thickness of about 100 nm and can be structured with conventional methods in stripes. The light-permeable electrodes 2 constitute the anodes of the display device. Furthermore, a plurality of insulating ribs 6 are arranged on the transparent electrodes so as to extend in a direction perpendicular to the transparent electrodes 2.

The insulating ribs are positioned to build the spacings between the later formed cathode electrodes. The insulating ribs, preferrably made of photo resist, will be heated to approximately 220° C. thereby getting cross-linked and resistant against solving agents and chemicals. At the same time the edges of the insulating ribs 6 opposite to the transparent electrodes 2 will be chamfered. Chamfering of the edges of the insulating ribs 6 is favorable when providing the at least one organic layer 3 (FIG. 1b) and the conductive film for (FIG. 1c) which will be formed all over the at least one organic layer 3.

Although only one organic layer 3 is illustrated in this embodiment it is apparent to one skilled in the art, that a predetermined number of functional layers each built of an organic material can be provided. For instance the organic layer can be build of PEDOT which has a thickness of about 100 nm and PPV which has a thickness of approximately 100 nm. The conductive film forming the cathode electrodes can be build of calcium with a thickness of approximately 10 nm and aluminium with a thickness of approximately 300 nm. The conductive film can be build by vacuum deposition.

When the thickness of the conductive film 4 is higher than the height of the insulating ribs 6 adjacent cathode stripes extending perpendicular to the stripe-like transparent electrodes can comprise an electric connection. To ensure that there will be an isolation between each adjacent stripe-like electrode 4 at least one portion of the conductive film on the insulating ribs will be removed using a radiation method. Advantageously a laser beam or an electron beam will be used for removing parts of the conductive film.

Figure 1D:
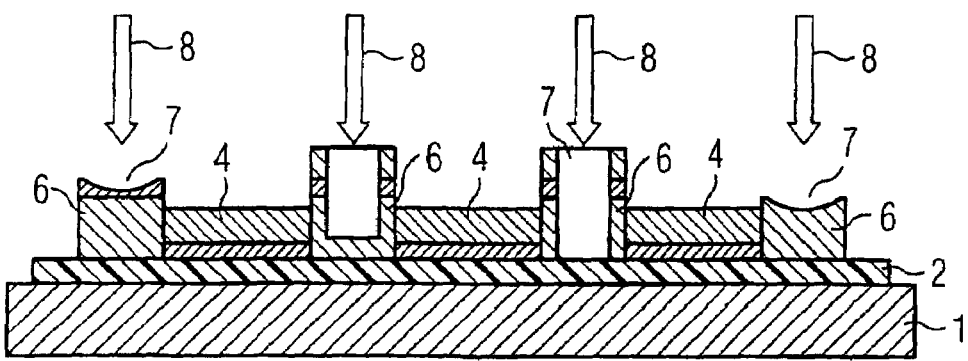

FIG. 1d depicts four different examples of the insulating member after carrying out the radiation method. In the most left example the conductive film 4 on the insulating rib is removed completely. Additionally a portion of organic layer 3 has been removed thereby forming a valley or a groove. In the right adjacent example the insulating member has the shape of an "U". The laser or electron beam has removed parts of the conductive layer 4, of the at least one organic layers 3 and the insulating rib 6. As the next adjacent example shows, the groove can extend to the transparent electrode. When carrying out the radiation method it has to be ensured that the transparent electrode 2 will not be hurt. If the transparent electrodes 2 are separated by the laser or electron beam the functionality of the display device can be no more longer maintained. The relative thick insulating ribs 6 help to prevent, the transparent electrode 2 not be hurt even if more material than the conductive film is removed. The outermost right example shows an insulating member where the conductive film 4 and the at least one organic layer 3 have been removed. As noted above a slight valley in the insulating rib is the result.

Figure 2A:
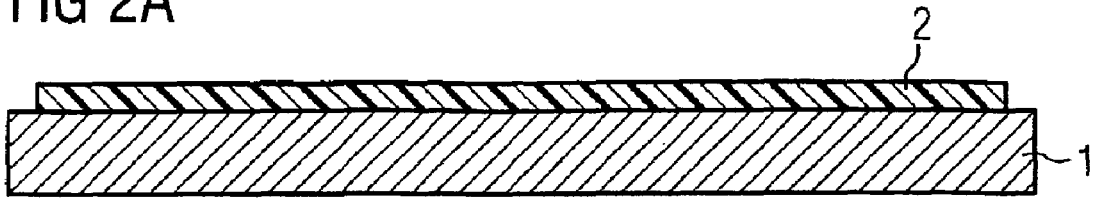
Figure 2B:
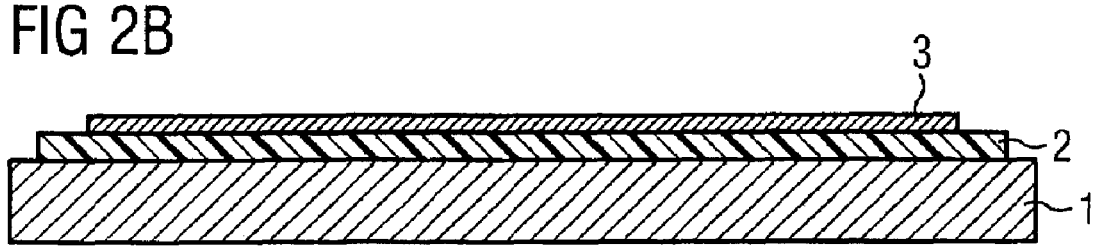
Figure 2C:
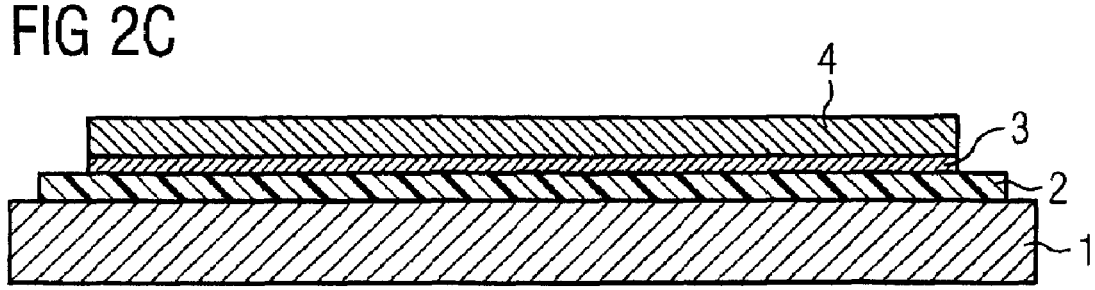
Figure 2D:
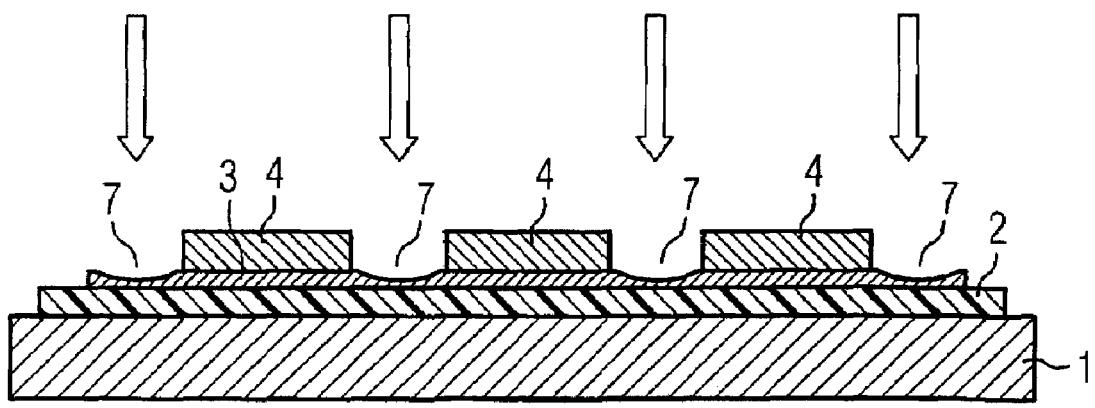

In contrast to the first embodiment FIGS. 2a-2d show another embodiment of a method for manufacturing a display device where no insulating ribs are provided (FIG. 2a). As shown in FIG. 2b the at least one organic layer 3 is formed all over the transparent electrodes 2. Accordingly the conductive film 4 is formed all over the at least one organic layer 3. Electric isolation between the stripe-like electrodes 4 is carried out by using a radiation method. As a result portions of the conductive film will be removed using a laser or an electron beam so as to create the stripe-like electrodes beeing electrical isolated to each other and extending in a direction perpendicular to the transparent electrodes. As can be seen in FIG. 2d at these places small valleys in the at least one organic layer have been created.

Further steps to create an organic electro-luminescent display device comprising an upper substrate made of an insulating material such as glass or the like and having a getter material application area is well known to those skilled in the art. A detailed example of such an electronic device is illustrated in U.S. Pat. No. 5,804,917.

The method according to the present invention is very advantageous for building passive matrix displays, organic display devices with structured lightning areas and segmented OLED-displays. The structuring of electrodes using a radiation method is very advantageous because of a very high resolution of focussed laser beams. It is possible to create a display device without using shadow masks. By separating the cathode stripes a high yield and process security is provided. By using insulating ribs it is assured that whether the transparent substrate nor the transparent electrodes will be hurt. The process is much more easier compared to conventional structuring processes because several process steps can be dropped.

The invention claimed is:

1. A method for manufacturing an organic electro-luminescent device, the method comprising the steps of:
    providing a substrate;
    arranging at least one first electrode on substrate, the first electrode being made of a first conductive film to form a subassembly;
    forming a plurality of insulating ribs on the first electrode;
    forming at least one organic layer on the subassembly, the at least one organic layer being made of an organic electro-luminescent medium, so that the at least one organic layer covers the first electrodes;
    forming a second conductive film over the at least one organic layer; and
    removing at least one portion of the second conductive film using a radiation method to create second electrodes that are electrically isolated from each other; wherein removing the at least one portion of the second conductive film includes removing a portion of the second conductive film from over the insulating ribs and removing at least a portion of the insulating ribs.

2. A method for manufacturing a display device according to claim 1, wherein the step of arranging at least one first electrode comprises arranging a plurality of electrodes in a stripe-like manner to form lower stripe-like electrodes.

3. A method for manufacturing a display device according to claim 2, wherein the step of removing at least one portion of the second conductive film comprises creating stripe-like electrodes extending in a direction perpendicular to the lower stripe-like electrodes.

4. A method for manufacturing a device according to claim 1, wherein the step of removing at least one portion of the second conductive film using a radiation method comprises using a laser beam.

5. A method for manufacturing a display device according to claim 1, wherein the step of removing at least one portion of the second conductive film using a radiation method comprises using an electron beam.

6. A method for manufacturing a device according to claim 1, wherein the step of removing at least one portion of the second film comprises removing at least a portion of the organic layer.

7. A method for manufacturing a device according to claim 1, wherein the step of forming a second conductive film is carried out by vacuum deposition.

8. A method for manufacturing a device according to claim 2, wherein forming a plurality of insulating ribs includes forming the insulating ribs in a stripe-like manner on the lower stripe-like electrodes the, insulating ribs extending in a direction perpendicular to the lower stripe-like electrodes.

9. A method for manufacturing a device according to claim 1, wherein the step of forming the plurality of ribs on the first electrode comprises arranging the plurality of ribs in laterally spaced rows parallel to each other.

10. A method for manufacturing a device according to claim 1, wherein the step of forming the plurality of ribs on the first electrode comprises heating the ribs to cross-link the material of the ribs.

11. A method for manufacturing a device according to claim 10, wherein the plurality of ribs are made of a photoresist and are subjected to heat of approximately 220° C.

12. A method for manufacturing a device according to claim 1, wherein the step of forming the plurality of ribs on the first electrode comprises chamfering the edges of the ribs opposite to the first electrode.

13. A method for manufacturing a device according to claim 1, wherein removing the at least one portion of the second conductive film comprises removing parts of the insulating rib thereby shaping the insulating rib into a "U"-shape.

14. An organic electro-luminescent device comprising:
a substrate;
at least one lower electrode arranged on the substrate and formed of a lower conductive film;
a plurality of insulating members each comprising a valley and consisting at least partially of insulating material and arranged on the lower electrode;
at least one organic layer formed of an organic electro-luminescent medium and arranged at least between two adjacent insulating members; and
upper electrodes made of a second conductive film deposited over the at least one organic layer.

15. A device according to claim 14, wherein the lower electrode is one of a plurality of strip-like lower electrodes.

16. A device according to claim 15, further comprising a plurality of stripe-like isolating members extending in a direction perpendicular to the lower electrodes.

17. A device according to claim 14, wherein the insulating members form structures that comprise portions of the organic electroluminescent medium.

18. A device according to claim 14, wherein the insulating material forms insulating ribs on the lower electrode.

19. A device according to claim 14, wherein the insulating material forms insulating ribs on the lower electrode and the organic electro-luminescent medium is over the insulating ribs.

20. A device according to claim 14, wherein the insulating material forms insulating ribs on the lower electrode, the organic electro-luminescent medium is over the insulating ribs and part of the second conductive film is over the organic electro-luminescent medium 21. A device according to claim 14, wherein the insulating member is in the shape of a "U" and a base of the "U" is closer to the electrode than ends of legs of the "U".

22. A device according to claim 21, wherein the ends of the legs of the "U" comprise the medium of the at least one organic layer.

23. A device according to claim 21, wherein the ends of the legs of the "U" comprise material of the second conductive film.

\* \* \* \* \*

UNITED STATES PATENT AND TRADEMARK OFFICE
CERTIFICATE OF CORRECTION

PATENT NO.        : 7,498,737 B2                                          Page 1 of 1
APPLICATION NO.   : 10/569818
DATED             : March 3, 2009
INVENTOR(S)       : Ewald Karl Michael Guenther, Karsten Heuser and Georg Wittmann It is certified that error appears in the above-identified patent and that said Letters Patent is hereby corrected as shown below:

On the Cover Page, Column 1, below Prior Publication Data, insert:

-- Related U.S. Application Data --

-- (60) Provisional application No. 60/498,439, filed Aug. 27, 2003. --

Signed and Sealed this

Twenty-first Day of April, 2009

JOHN DOLL
*Acting Director of the United States Patent and Trademark Office*

UNITED STATES PATENT AND TRADEMARK OFFICE
CERTIFICATE OF CORRECTION

| | | |
|---|---|---|
| PATENT NO. | : 7,498,737 B2 | Page 1 of 2 |
| APPLICATION NO. | : 10/569818 | |
| DATED | : March 3, 2009 | |
| INVENTOR(S) | : Ewald Karl Michael Guenther, Karsten Heuser and Georg Wittmann | |

It is certified that error appears in the above-identified patent and that said Letters Patent is hereby corrected as shown below:

Column 6, Line 34 at Claim 1; replace:
"arranging at least one first electrode on substrate, the first" with
-- arranging at least one first electrode on the substrate, the first --

Column 6, Line 41 at Claim 1; replace:
"organic layer covers the first electrodes;" with
-- organic layer covers the first electrode; --

Column 6, Line 51 at Claim 2; replace:
"A method for manufacturing a display device according" with
-- A method for manufacturing a device according --

Column 6, Line 55 at Claim 3; replace:
"A method for manufacturing a display device according" with
-- A method for manufacturing a device according --

Column 6, Line 64 at Claim 5; replace:
"A method for manufacturing a display device according" with
-- A method for manufacturing a device according --

Column 7, Line 3 at Claim 6; replace:
"second film comprises removing at least a portion of the" with
-- second conductive film comprises removing at least a portion of the --

Column 7, Line 12 at Claim 8; replace:
"lower stripe-like electrodes the, insulating ribs extending in a" with
-- lower stripe-like electrodes, the insulating ribs extending in a --

Column 7, Line 32 at Claim 13; replace:
"second conductive film comprises removing parts of the insu-" with
-- second conductive film comprises removing parts of an insu- --

Column 8, Line 2 at Claim 14; replace:
"and consisting at least partially of insulating material" with
-- and consisting at least partially of an insulating material --

UNITED STATES PATENT AND TRADEMARK OFFICE
CERTIFICATE OF CORRECTION

PATENT NO.         : 7,498,737 B2
APPLICATION NO.    : 10/569818
DATED              : March 3, 2009
INVENTOR(S)        : Ewald Karl Michael Guenther, Karsten Heuser and Georg Wittmann It is certified that error appears in the above-identified patent and that said Letters Patent is hereby corrected as shown below:

Column 8, Line 27 at Claim 20; replace:
    "electro-luminescent medium" with
    -- electro-luminescent medium. --

Signed and Sealed this

Nineteenth Day of May, 2009

JOHN DOLL
*Acting Director of the United States Patent and Trademark Office*